(12) United States Patent
Yoshimura et al.

(10) Patent No.: US 10,649,334 B2
(45) Date of Patent: May 12, 2020

(54) LIQUID PROCESSING APPARATUS

(71) Applicant: Tokyo Electron Limited, Tokyo (JP)

(72) Inventors: Koki Yoshimura, Kumamoto (JP);
Shogo Takahasi, Kumamoto (JP);
Yasushi Takiguchi, Kumamoto (JP);
Taro Yamamoto, Kumamoto (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 16/100,609

(22) Filed: Aug. 10, 2018

(65) Prior Publication Data
US 2019/0049845 A1 Feb. 14, 2019

(30) Foreign Application Priority Data

Aug. 10, 2017 (JP) ................... 2017-155853

(51) Int. Cl.
*G03F 7/16* (2006.01)
*H01L 21/67* (2006.01)
*G03F 7/30* (2006.01)
*H01L 21/683* (2006.01)

(52) U.S. Cl.
CPC .............. *G03F 7/16* (2013.01); *G03F 7/162* (2013.01); *G03F 7/3021* (2013.01); *H01L 21/6715* (2013.01); *H01L 21/67017* (2013.01); *H01L 21/6719* (2013.01); *H01L 21/6838* (2013.01)

(58) Field of Classification Search
CPC .......... G03F 7/16; G03F 7/162; G03F 7/3021; H01L 21/6715; H01L 21/67017; H01L 21/67051; H01L 21/6719; H01L 21/67259; H01L 21/6838; H01L 27/00
See application file for complete search history.

(56) References Cited

U.S. PATENT DOCUMENTS

| | | | | |
|---|---|---|---|---|
| 2001/0003964 A1* | 6/2001 | Kitano | ................... | G03F 7/162 118/50 |
| 2007/0044823 A1* | 3/2007 | Yamamoto | ........ | H01L 21/67051 134/33 |
| 2008/0280054 A1* | 11/2008 | Ogata | ............... | H01L 21/67051 427/425 |

(Continued)

FOREIGN PATENT DOCUMENTS

| | | |
|---|---|---|
| JP | 2012-028571 A | 2/2012 |
| JP | 2015-026744 A | 2/2015 |

*Primary Examiner* — Deoram Persaud
(74) *Attorney, Agent, or Firm* — Abelman, Frayne & Schwab

(57) ABSTRACT

Disclosed is a liquid processing apparatus for performing a liquid processing by supplying a processing liquid from a nozzle to a substrate. The apparatus includes: a cup body provided to surround a substrate holding unit; a nozzle arm provided with a nozzle and supported by a support unit; a moving mechanism configured to move the nozzle arm via the support unit between a stand-by position and a processing position; an elevating mechanism configured to move up and down the support unit; a cover member including a top plate portion provided above a driving region and configured to partition the driving region from a region where the substrate is held within the cup body; an opening formed in a portion corresponding to a moving path of the support unit in the top plate portion; and an exhaust mechanism configured to evacuate the driving region.

10 Claims, 12 Drawing Sheets

(56) References Cited

U.S. PATENT DOCUMENTS

| | | | | |
|---|---|---|---|---|
| 2009/0035021 A1* | 2/2009 | Yamamoto | ............ | G03F 7/3021 399/222 |
| 2009/0250079 A1* | 10/2009 | Yoshihara | ............... | B08B 3/024 134/4 |
| 2011/0200952 A1* | 8/2011 | Takiguchi | ............. | G03F 7/3021 430/434 |
| 2011/0200953 A1* | 8/2011 | Arima | .................... | G03F 7/3021 430/434 |
| 2012/0052190 A1* | 3/2012 | Sasagawa | ........... | H01L 21/6715 427/58 |
| 2015/0027492 A1* | 1/2015 | Takiguchi | ......... | H01L 21/68792 134/6 |
| 2015/0027503 A1* | 1/2015 | Takiguchi | ......... | H01L 21/67051 134/95.2 |
| 2017/0338131 A1* | 11/2017 | Amahisa | ........... | H01L 21/67051 |

\* cited by examiner

FACTORY EXHAUST ←

LIQUID PROCESSING APPARATUS

CROSS-REFERENCE TO RELATED APPLICATIONS

This application is based on and claims priority from Japanese Patent Application No. 2017-155853 filed on Aug. 10, 2017 with the Japan Patent Office, the disclosure of which is incorporated herein in its entirety by reference.

TECHNICAL FIELD

The present disclosure relates to a liquid processing apparatus in which a substrate is processed by supplying a processing liquid to the substrate from a nozzle.

BACKGROUND

In a photoresist process, which is one of manufacturing processes of a semiconductor device, a resist pattern is formed by applying a resist to a surface of a semiconductor wafer (hereinafter, referred to as a "wafer"), exposing the resist into a predetermined pattern, and developing the exposed resist. Such a process is generally performed by using a system in which an exposure apparatus is connected to a coating and developing apparatus for coating and developing a resist, and the coating and developing apparatus is provided therein with various liquid processing apparatuses for supplying a processing liquid such as, for example, a resist liquid or a developer to a wafer.

In such a liquid processing apparatus, a semiconductor wafer (hereinafter, referred to as a "wafer") serving as a substrate is disposed in a substrate holding unit in a state where a nozzle for discharging a processing fluid, as disclosed in Japanese Patent Laid-Open Publication Nos. 2015-026744 and 2012-028571, is located in a stand-by position which is spaced apart from the wafer. In addition, it is known that a liquid processing is performed by moving the nozzle to the upper side of the wafer and ejecting the processing fluid toward the wafer.

In addition, in an apparatus for performing, for example, development, after developer is supplied to a wafer and the development is completed, for example, a cleaning liquid and an inert gas from dedicated nozzles are respectively ejected from dedicated nozzles to remove dissolved matters from the surface of the wafer.

A moving mechanism for moving a processing fluid nozzle that ejects a processing liquid or a processing gas is configured to be moved along a guide rail by driving a ball screw mechanism including, for example, a ball screw. In addition, a pipe is connected to the moving mechanism to transmit power thereto, and a pipe restricting member is provided so as to restrict a bending direction of the pipe.

There is a concern that such a ball screw, a guide rail, or a pipe restricting member may generate dust when the moving mechanism moves. Thus, the dust generated from the moving mechanism may be scattered above a cup body and adhere to the wafer held in the substrate holding unit.

SUMMARY

According to an aspect of the present disclosure, there is provided a liquid processing apparatus for performing a liquid processing by supplying a processing liquid from a nozzle to a substrate. The apparatus includes: a cup body provided to surround a substrate holding unit that horizontally holds the substrate; a nozzle arm provided with a nozzle in a front end portion thereof and supported by a support unit at a rear end portion thereof; a moving mechanism configured to move the nozzle arm via the support unit between a stand-by position and a processing position where a processing fluid is supplied from the nozzle to the substrate; an elevating mechanism configured to move up and down the support unit; a cover member including a top plate portion provided above a driving region where the moving mechanism and the elevating mechanism are disposed and configured to partition the driving region from a region where the substrate is held within the cup body; an opening formed in a portion corresponding to a moving path of the support unit in the top plate portion so as to allow the support unit to move therethrough; and an exhaust mechanism configured to evacuate the driving region.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
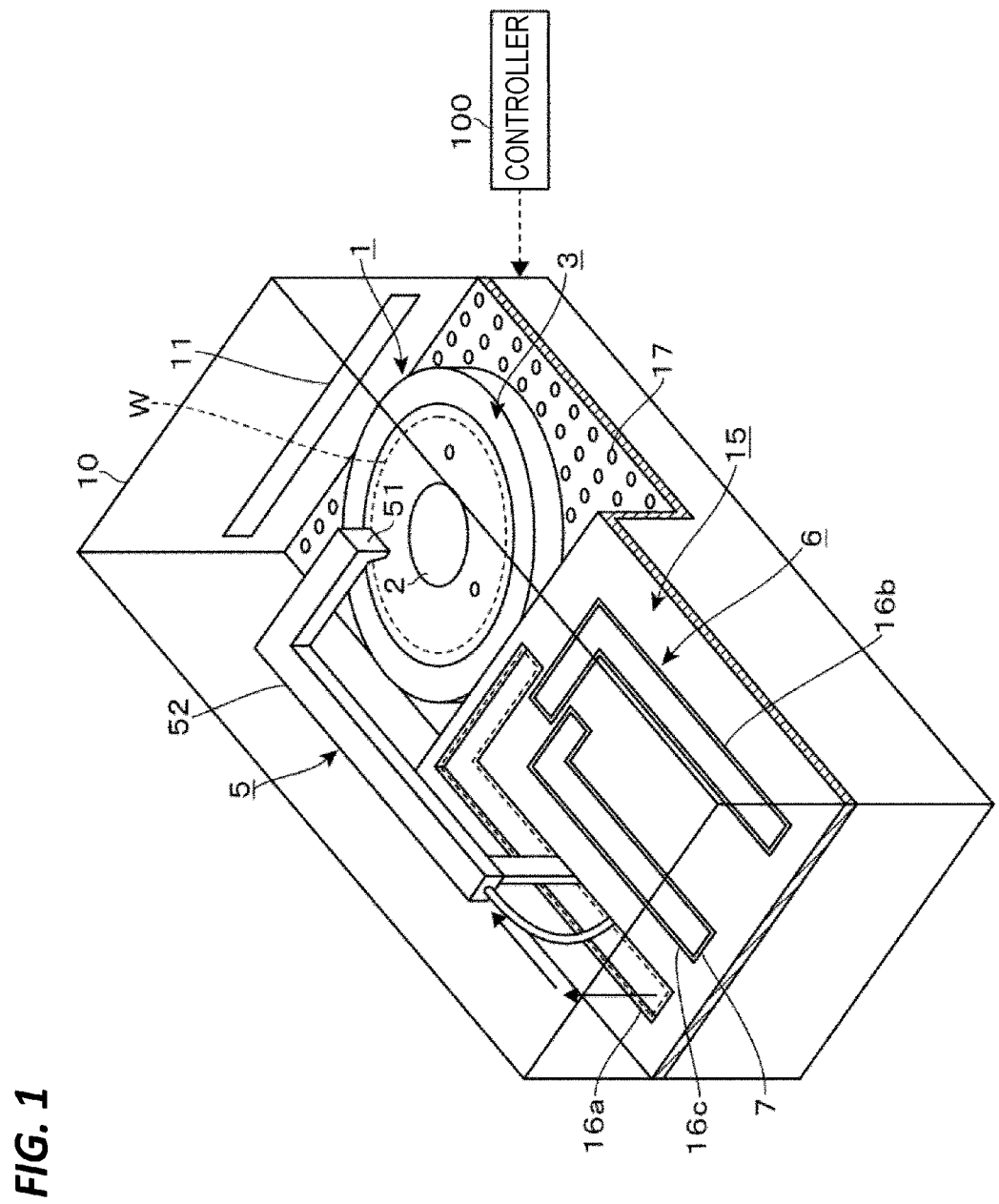
FIG. 1 is a perspective view illustrating a developing apparatus of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made under such circumstances, and an object thereof is to provide a technique for suppressing adhesion of particles to a substrate in a liquid processing apparatus that performs a liquid processing by supplying a processing liquid to the substrate.

The present disclosure provides a liquid processing apparatus for performing a liquid processing by supplying a processing liquid from a nozzle to a substrate. The apparatus includes: a cup body provided to surround a substrate holding unit that horizontally holds the substrate; a nozzle arm provided with a nozzle in a front end portion thereof and supported by a support unit at the rear end portion thereof; a moving mechanism configured to move the nozzle arm via the support unit between a stand-by position and a processing position where a processing fluid is supplied from the nozzle to the substrate; an elevating mechanism configured to move up and down the support unit; a cover member including a top plate portion provided above a driving region where the moving mechanism and the elevating mechanism are disposed and configured to partition the driving region from a region where the substrate is held within the cup body; an opening formed in a portion corresponding to a moving path of the support unit in the top plate portion so as to allow the support unit to move therethrough; and an exhaust mechanism configured to exhaust the driving region.

The above-described liquid processing apparatus may further include a partition plate provided to surround the cup body and defining an upper side space and a lower side space, and the cover member is formed continuously with the partition plate.

In the above-described liquid processing apparatus, the stand-by position may be located on a rear side of the cup body, the moving mechanism may be configured to move the nozzle arm in a front and rear direction, and the opening may be configured to be blocked by the nozzle arm located at the stand-by position.

The above-described liquid processing apparatus may include a plurality of nozzle arms configured to be independently movable in a lateral direction and be movable up and down. A plurality of support units may be arranged in a left and right direction with respect to each other to respectively support the plurality of nozzle arms, and a plurality of nozzles respectively provided in the plurality of nozzle arms may be arranged in the front and rear direction with respect to each other.

In the above-described liquid processing apparatus, when a nozzle is moved from the stand-by position to supply a processing fluid in the plurality of nozzles to the substrate, another nozzle may be located at the stand-by position.

In the above-described liquid processing apparatus, a horizontal dimension of a gap between a lateral edge of the nozzle arm and an edge of the opening is within 7 mm.

The above-described liquid processing apparatus may further include a first exhaust port opened to the cup body, a second exhaust port opened to the lower region of the partition plate, and a switching mechanism configured to switch an exhaust flow rate ratio between the first exhaust port and the second exhaust port. The partition plate is provided with a plurality of vent holes that draws an atmosphere on the upper side of the partition plate to the lower side of the partition plate.

In the above-described liquid processing apparatus, when the nozzle arm is moved from the stand-by position to the processing position, the switching mechanism may be switched such that an exhaust flow rate of the second exhaust port is larger than an exhaust flow rate of the first exhaust port.

The above-described liquid processing apparatus may further include a wiring connected at one end to the moving mechanism and the elevating mechanism and configured to drive the moving mechanism and the elevating mechanism, a fixture configured to fix another end of the wiring such that the another end of the wiring is stationary when the moving mechanism moves, a wiring restricting member formed in an elongated shape having a joint portion and configured to be bent according to the movement of the moving mechanism to protect and guide a portion of the wiring between a connecting position at the one end of the wiring and a fixed position fixed to the fixture at the another end of the wiring. The wiring restricting member may be provided in a height position in the driving region, which is lower than a height position of the opening surface of the cup body.

In the present disclosure, the driving region where a mechanism for moving the support unit that supports the nozzle arm at the rear end thereof in the lateral direction and the vertical direction is disposed, is evacuated by providing a cover member to partition the driving region from a region where the substrate is held in the cup body. An opening for the movement of the support unit is formed in the top plate portion constituting the cover member. Accordingly, particles generated from the mechanisms provided in the driving region may be suppressed from adhering to the substrate within the cup.

Figure 2:
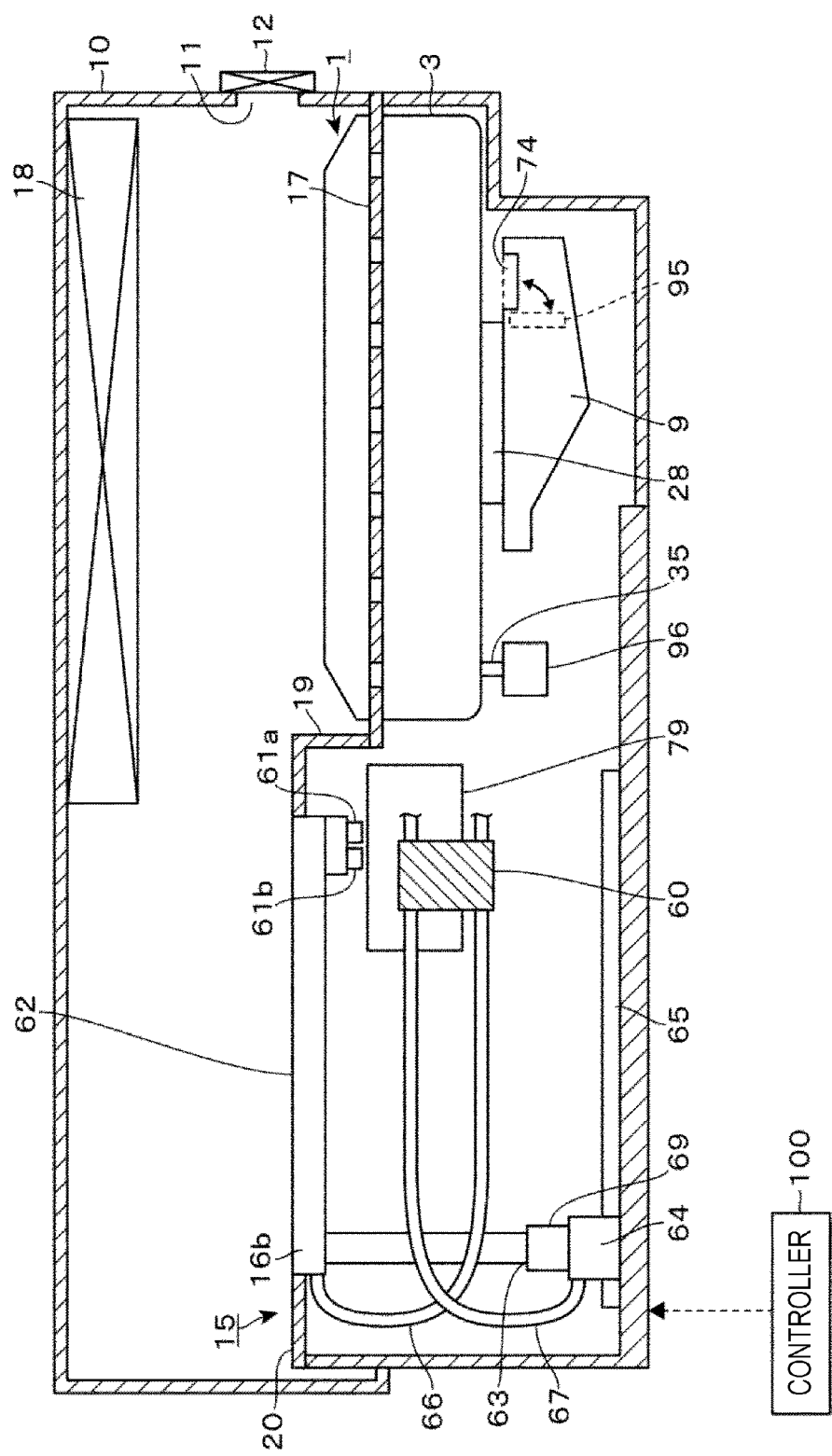
FIG. 2 is a vertical sectional side view of the developing apparatus.

Descriptions will be made on an example in which a liquid processing is applied to a developing apparatus according to an embodiment of the present disclosure. FIG. 1 is a schematic perspective view illustrating an embodiment of a developing apparatus, and FIG. 2 is a vertical sectional side view illustrating the developing apparatus. The developing apparatus includes a rectangular case 10, a carry-in/out port 11 through which a wafer W as a substrate is carried in/out is formed in a side surface which is an one end side of the longitudinal direction of the case, and the carry-in/out port 11 is provided with a shutter 12 that opens/closes the carry-in/out port 11. Assuming that a carry-in/out port 11 side of the case 10 is referred to the front side, and an inner side of the case 10 as viewed from the carry-in/out port 11 is referred to the rear side, a developing processing unit 1 is provided in the vicinity of the front side of the case 10. In the following specification, it is assumed that the carry-in/out port 11 side of the case 10 is the front side, and the inner side of the case 10 as viewed from the carry-in/out port 11 is the rear side.

The developing processing unit 1 will be described with reference to FIG. 3. The developing processing unit 1 includes a spin chuck 2, which is a substrate holding unit for attracting and holding a wafer W horizontally. The spin chuck 2 is configured to attract and hold the central portion of the back surface of the wafer W and be rotatable about a vertical axis. The spin chuck 2 is formed in a circular shape in a plan view, and is connected to a driving mechanism (spin chuck motor) 22 through a rotary lift shaft 21. In addition, the spin chuck 2 is connected to a suction pipe (not illustrated), and has a function as a vacuum chuck that attracts and holds a wafer W through a suction hole (not illustrated). In addition, three support pins 392 connected to an elevating mechanism 391 are provided in the side of the spin chuck 2 in the circumferential direction with a regular interval, and a wafer can be transferred to the spin chuck 2 by cooperative action of an external transfer mechanism and the support pins 392.

A cup body 3 formed in an annular shape in the plan view is provided around the spin chuck 2. The cup body 3 is configured to surround the lateral side and bottom side of the wafer W held in the spin chuck 2 in the circumferentially so as to suppress the scattering of the developer as a processing fluid and recover the developer. The cup body 3 is provided with an opening 31, which a diameter thereof is larger than the diameter of the wafer W, at the upper side of the cup body 3, and the wafer W can be transferred through the opening 31 between the spin chuck 2 and a transfer mechanism of a coating and developing apparatus to be described later.

In addition, the cup body 3 includes a side wall 32, the upper end side of the side wall 32 forms an inclined portion 321 which is inclined inward, and the bottom side of the cup body 3 is formed as a liquid receiving portion 33 having, for example, a concave shape. The liquid receiving portion 33 is partitioned into an external region and an inner region by a partition wall portion 36 which extends downward the peripheral edge side of an annular inner cup 34 and is formed over the entire periphery below the peripheral edge of the wafer W. A drain pipe 35 for discharging the drain of stored developer is connected to a bottom surface portion of the external region. A circular plate shaped flat plate portion 37 is provided in the inner peripheral side of the inner cup, and an edge portion 37a for forming a very narrow gap with the wafer W held by the spin chuck 2 is formed over the entire peripheral on the upper surface side of the peripheral portion of the flat plate portion 37.

An exhaust pipe 38 for exhausting the atmosphere within the cup body 3 protrudes from the bottom surface of the cup body 3 in each of the left and right positions of the spin chuck 2 in the inner side of the partition wall portion 36 when viewed from the rear side to the front side, and a top end of the exhaust pipe 38 forms a first exhaust port 39 opened to the inside of the cup body 3.

Figure 4:
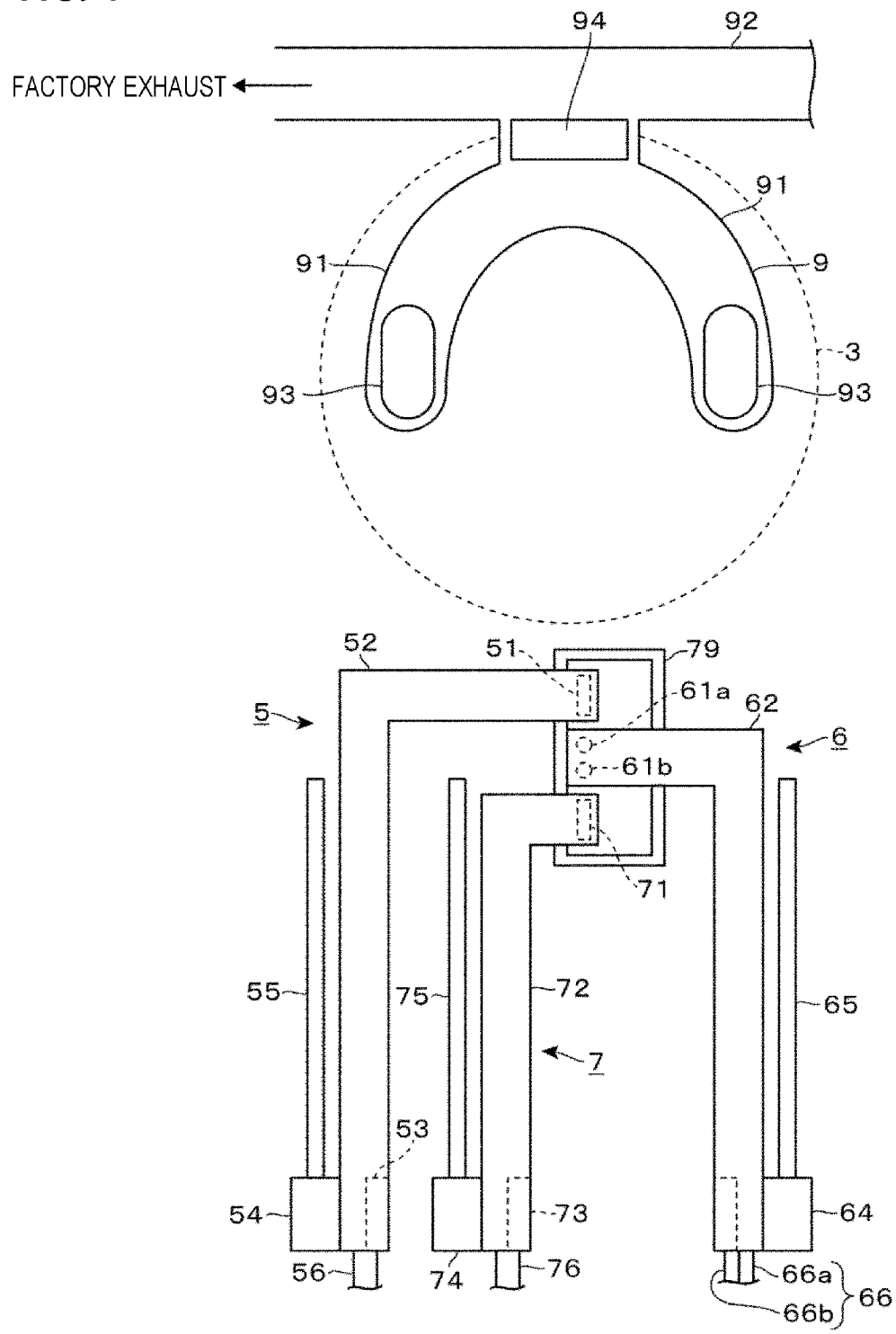
FIG. 4 is a plan view illustrating a region below a cover member and a punching plate in the developing apparatus.

As illustrated in FIGS. 2 and 4, an exhaust duct 9 serving as an exhaust path is provided below the cup body 3. The exhaust duct 9 is arranged so as to extend in the horizontal direction, and as illustrated in FIG. 4, one end side thereof branches into two ways to form branch duct 91, and the other end side thereof is connected to a collecting duct 92. As illustrated in FIGS. 2 and 4, an opening 93 is formed in the upper surface side in each of the end portions of the branch duct 91, and a lower end portion of the exhaust pipe 38 is connected to the opening 93. In addition, a second exhaust port 94 for exhausting the atmosphere within the case 10 is formed in the upper surface side of the exhaust duct 9, at the collecting duct 92 side rather than the branching position of the branching duct 91 of the exhaust duct 9, more specifically, between the cup body 3 and the carry-in/out port 11 formed in the case 10.

As illustrated in FIG. 2, the second exhaust port 94 is provided with an exhaust damper 95 for adjusting the flow rate ratio between the exhaust amount of the first exhaust port 39 and the exhaust amount of the second exhaust port 94. By adjusting the exhaust damper 95, it can be switched between a "cup exhaust" state where the exhaust amount of the first exhaust port 39 side increases and the exhaust amount of the second exhaust port 94 decreases to increase the exhaust amount of the inside cup body 3, and a "module exhaust" state where the exhaust amount of the first exhaust port 39 decreases and the exhaust amount of the second exhaust port 94 increases to increase the exhaust amount in the outer side of the cup body 3 than the inner side of the cup body 3. In addition, reference number 96 in FIG. 2 is a drain path for draining the liquid discharged from the drain pipe 35.

In addition, the developing apparatus includes a developing nozzle unit 5, a cleaning nozzle unit 6, and an auxiliary nozzle unit 7 that supply processing fluids to the wafer W held in the spin chuck 2. The developing nozzle unit 5 is used as a nozzle for supplying a developer as a first processing fluid, the cleaning nozzle unit 6 is used as a nozzle for supplying a cleaning liquid (a rinse liquid) and a dry gas, and the auxiliary nozzle unit 7 is used as a nozzle for supplying, a developer which is different from the developer supplied from the developing nozzle unit, for example, a developer to which a surfactant is added.

Figure 5:
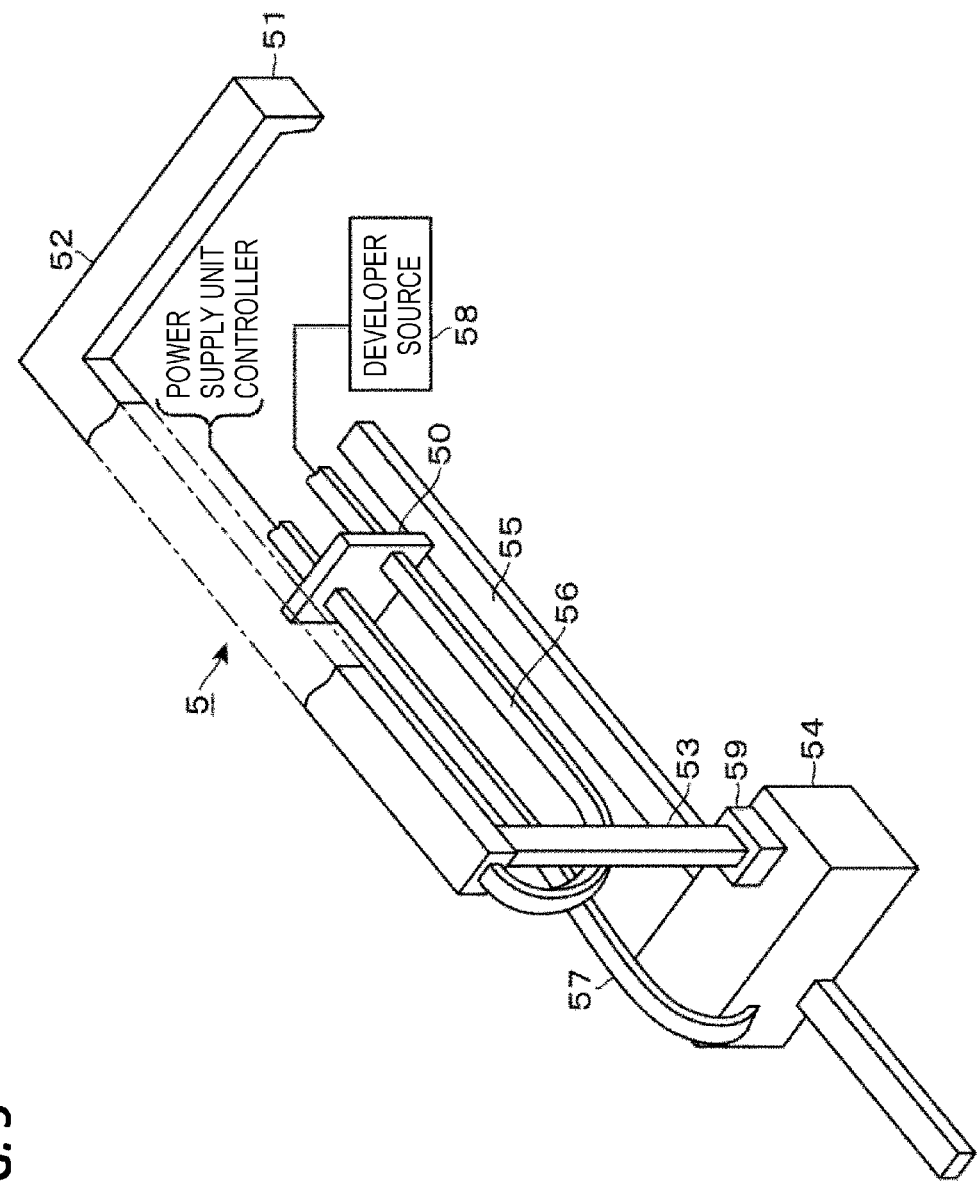
FIG. 5 is a perspective view illustrating a first nozzle unit.
Figure 6:
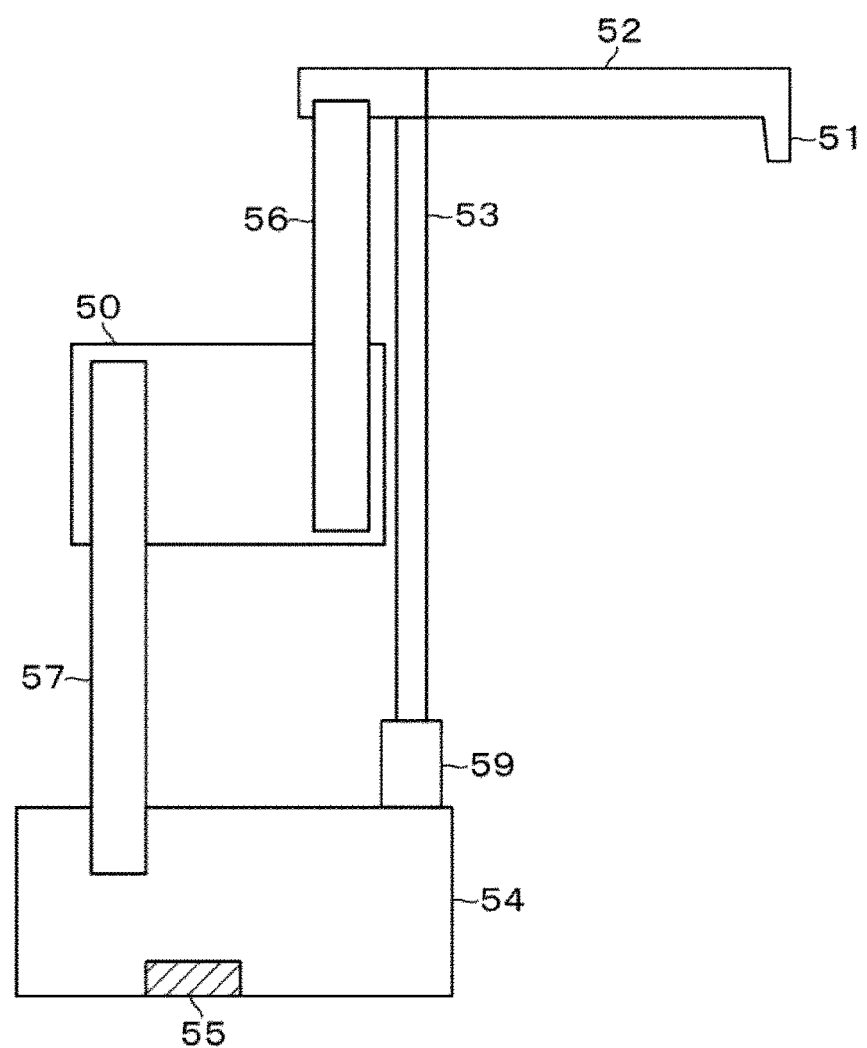
FIG. 6 is a side view of the first nozzle unit as viewed from the rear side.

The developing nozzle unit 5 includes a developing nozzle 51 which is opened in an elongate slit shape and extends in the front and rear direction in the lower end surface thereof, and configured to eject the developer in a band shape to an area including the central portion of the wafer W when the developing nozzle unit 5 is located in the processing position. As illustrated in FIGS. 1, 4, and 5, the developing nozzle 51 is provided in the tip end of a first nozzle arm 52 which extends horizontally in the front and rear direction, and the tip end side thereof is projected horizontally toward the right direction when viewed from the rear side to the front side. In addition, as illustrated in FIGS. 5 and 6, the rear end portion of the first nozzle arm 52 is connected to the top end of a support pillar 53 which is a support unit extending downwardly. The lower end of the support pillar 53 is connected to a moving base 54 through an elevating mechanism 59. In the developing nozzle unit 5, the lower end of the support pillar 53 is connected to a position which is right in the moving base 54. The elevating mechanism 59 is connected to a guide post (not illustrated) which, for example, extends to a half of the height position of the height position of a top surface of a top plate portion 20 to be described later from the top surface of the moving base 54, and is configured to elevate the support pillar 53 by, for example, a ball screw mechanism and the like.

In addition, in the bottom surface of the case 10, provided are a guide rail 55 extending in the front and rear direction, and a driving mechanism (not illustrated) including, for example, a motor, a timing belt, and a pulley for moving the moving base 54 in the front and rear direction along the guide rail 55. The motor rotates the pulley to drive the timing belt, and thus, the moving base 54 moves in the front and rear direction along the guide rail 55. The moving base 54, the driving mechanism, and the guide rail 55 constitute a moving mechanism for moving the developing nozzle 51 forward and rearward in the front and rear direction.

In addition, in the developing nozzle unit 5, the guide rail 55 is provided in a position which is lefter than the first nozzle arm 52, and the guide rail 55 is connected to a position which is lefter in the moving base 54. In addition, as illustrated in FIG. 2, the moving mechanism including the moving base 54 and the guide rail 55 is provided in a position which is lower than the top end of the cup body 3.

In addition, a developer supplying path (not illustrated) which downstream end portion thereof is connected to the developing nozzle 51 is formed within the first nozzle arm 52, and as illustrated in FIG. 5, the upstream end portion of the developer supplying path is connected to one end side of a developer supply pipe 56 which is connected to the side surface at the rear side of the base end of the first nozzle arm 52. The developer supply pipe 56 bends downwardly, and the other end side is further drawn toward the front side. As illustrated in FIGS. 5 and 6, when the first nozzle arm 52 side of the developer supply pipe 56 is referred to as a downstream side, an upstream side portion of the developer supply pipe 56 is fixed to a fixture 50 which is arranged below the moving path of the first nozzle arm 52 such that the fixture 50 is not interfere with the first nozzle arm 52, the support pillar 53, and the moving base 54. As a result, it is configured that, when the moving base 54 moves, a portion of the developer supply pipe 56 fixed to the fixture 50 is a stationary side, and a downstream side than the fixture 50 of the developer supply pipe 56 is freely bent and deformed. In addition, an upstream side than the fixture 50 of the developer supply pipe 56 is further drawn to be connected to a developer source 58 to be described later.

In addition, one end of a wiring portion 57 including a power supplying line for driving the elevating mechanism, for example, a motor of a ball screw, to elevate the nozzle arm 52 in the top and bottom direction and a signal line for transmitting a signal wave of a moving position confirmation sensor, is connected to the moving base 54. The wiring portion 57 bends upwardly, and the other end side of the wiring portion 57 is further drawn toward the front side. The other end side of the wiring portion 57 is fixed to a position in the vicinity of the left-upper of the fixture 50 described above, and in the other end side than the fixture 50 of the wiring portion 57, for example, a signal line is connected to a controller and a power line is connected to a power supply unit.

Figure 7:
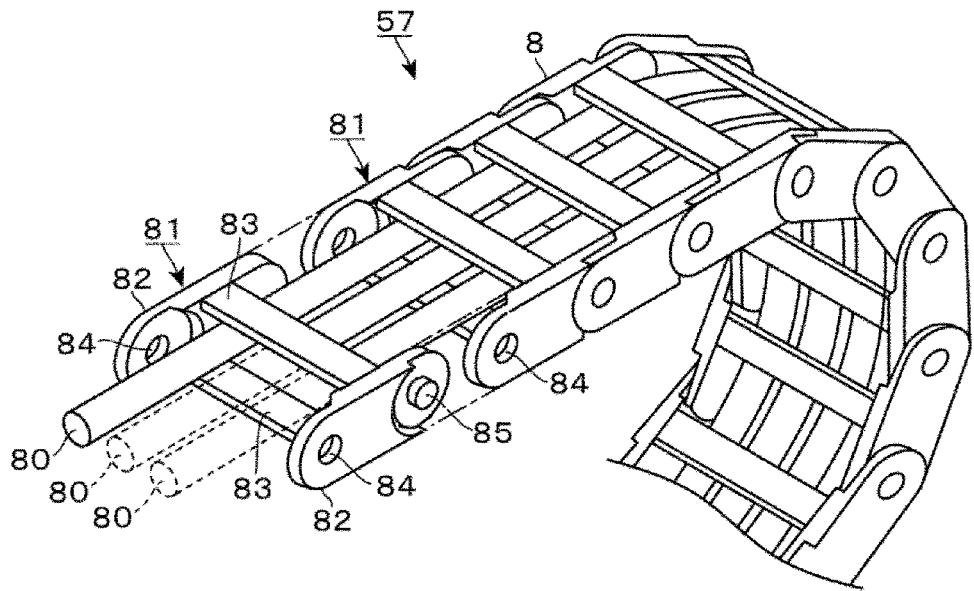
FIG. 7 is a perspective view illustrating a wiring regulating member.

In addition, a portion of the wiring portion 57 between the moving base 54 and the fixture 50 is provided with a wiring restricting member 8 to restricting the bending direction of the wiring portion 57. As illustrated in FIG. 7, the wiring restricting member 8 is constituted to connect a plurality of connecting members 81 in the length direction of the wiring restricting member 8. Each of the connecting members 81 includes two connecting plates 82 arranged to face each other, and both ends (one end side and the other end side of the connecting member 81) of the two connecting plates 82 in the width direction are formed to be fixed to each other by a bridge plate 83. A step portion is formed in each of the surfaces facing each other (inner surfaces) of the one end side in the length direction of the each of the two connecting plates 82, and a connecting hole 84 penetrating in the depth direction is formed in the step portion. In addition, in each of the other end side in the length direction of each of the two connecting plates 82, a step portion is formed in the outer surface thereof, and a connecting pin 85 protruding toward the outside is formed in the step portion. Each connecting member 81 is formed in state where the one end side of a connecting plate 82 and the other end side of an adjacent connecting plate 82 in the length direction are engaged with each other. And, the connecting members 81 adjacent to each other are connected in the length direction of the connecting plate 82 by fitting a connecting pin 85 into a connecting hole 84. At this time, the connecting plates 82 fitted to each other are able to be rotated within a predetermined angle range using the connecting pin 85 as a rotating axis. However, the two connecting plates 82 are fixed to each other by the bridge plate 83, and thus, the movement in the thickness direction (the direction in which two connecting plates 82 facing to each other are aligned in parallel) is restricted.

The wiring restricting member 8 is formed in an elongated shape in which a plurality of connecting members 81 are connected in the length direction of the connecting plate 82 to form a plurality of joint portions, and wirings 80 such as, for example, a power supplying line and a signal line are arranged in the width direction of the wiring restricting member 8 between the bridge plates 83 in each of the connecting members 81. Thus, each of the wirings 80 can be bent in the thickness direction of the wiring restricting member 8, but the movement in the thickness direction of the connecting plate 82, i.e., in the width direction of the wiring restricting member 8 is restricted. The wiring portion 57 is connected to the moving base 54 such that the thickness direction of the wiring restricting member 8 is parallel to the top and down direction of the moving base 54, is bent at the rear side of the moving base 54 toward the front side, and is connected to the fixture 50 in a state where the top and down direction of the wiring restricting member 8 is reversed.

As illustrated in FIG. 6, the wiring portion 57 and the developer supply pipe 56 are spaced apart from each other so as not to intersect each other and the wiring portion 57 is restricted from being bent in the left and right direction by the wiring restricting member 8. Thus, when the moving base 54 moves along the guide rail 55, the wiring portion 57 and the developer supply pipe 56 are configured not to intersect each other. In addition, the wiring portion 57 is provided at a position lower than the top end of the cup body 3.

The cleaning nozzle unit 6 is configured as a combined nozzle including a cleaning nozzle 61a for ejecting a cleaning liquid, for example, deionized water, and a gas nozzle 61b for supplying a dry gas, for example, a nitrogen gas. As illustrated in FIG. 4, the cleaning nozzle unit 6 includes a second nozzle arm 62, a support pillar 63, a moving base 64, and a guide rail 65, as similar to the developing nozzle unit 5, and the second nozzle arm 62, the support pillar 63, the moving base 64, and the guide rail 65 have shapes in which the left and right are reversed from the first nozzle arm 52, the support pillar 53, the moving base 54, and the guide rail 55 illustrated in FIG. 5.

In addition, a cleaning liquid supplying path and a gas supplying path (all not illustrated) connected to the cleaning nozzle 61a and the gas nozzle 61b, respectively, are formed inside the second nozzle arm 62, the cleaning liquid supplying path and the gas supplying path are connected to a cleaning liquid supply pipe 66a and a gas supply pipe 66b which are connected to the side surface of the rear side of the base end of the second nozzle arm 62, respectively. In the example, the cleaning liquid supply pipe 66a and the gas supply pipe 66b are formed as a band shaped pipe 66 in which lateral sides of the cleaning liquid supply pipe 66a and the gas supply pipe 66b are connected to each other. The band shaped pipe 66 bends downward from the base end of the second nozzle arm 62 and the other end is further drawn toward the front side.

In addition, as illustrated in FIG. 2, a wiring portion 67 having a wiring restricting member 8 is connected to the moving base 64, as similar to the moving base 54 provided in the developing nozzle unit 5. The band shaped pipe 66 and the wiring portion 67, as similar to the example of the developing nozzle unit 5, are fixed to the fixture 60 such that wirings 80 and the band shaped pipe 66 do not intersect each other. Thus, an area of the band shaped pipe 66 from the fixture 60 to the second nozzle arm 62 is configured to be freely bendable, and an area of the wiring portion 67 from the fixture 60 to the second nozzle arm 62 is configured to be restricted from being bent in the left and right direction and slidable in the front and rear direction.

In addition, the auxiliary nozzle unit 7 is configured in substantially the same manner as the developing nozzle unit 5 illustrated in FIG. 5. In FIG. 4, a third nozzle arm, a support pillar, a moving base, and a guide rail in the third nozzle unit 7 are indicated as reference numerals 72, 73, 74, and 75, respectively.

Figure 3:
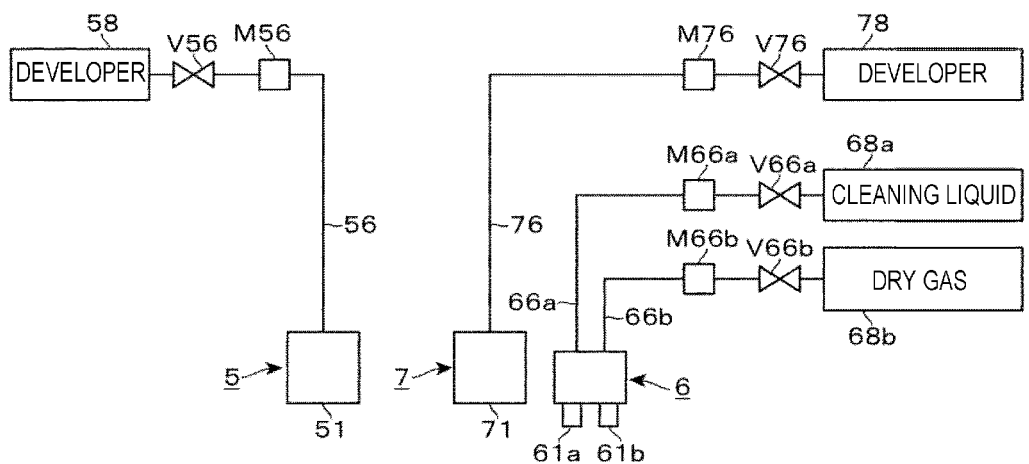
FIG. 3 is a cross-sectional view illustrating a developing processing unit.
Figure 3:
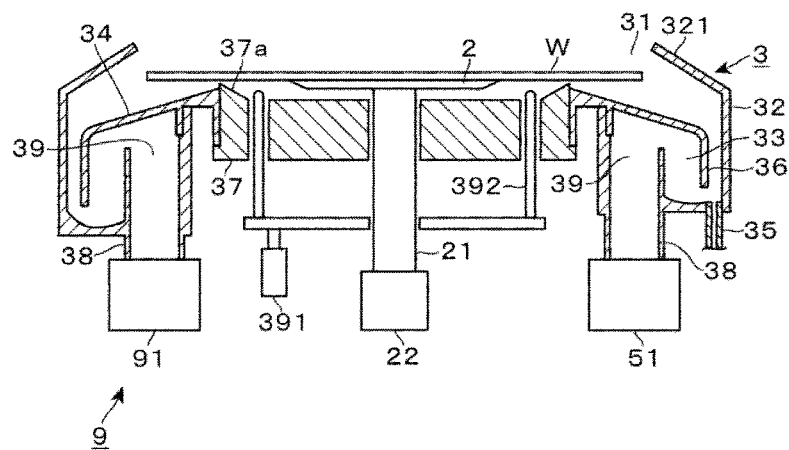

In addition, as illustrated in FIG. 3, the developing nozzle 51, the cleaning nozzle 61a and the gas nozzle 61b of the cleaning nozzle unit 6, and the auxiliary nozzle 71 are connected to the developer source 58, the cleaning liquid source 68*a*, the gas source 68*b*, and the developer source 78 through the developer supply pipe 56, the cleaning liquid supply pipe 66*a*, the gas supply pipe 66*b*, and the developer supply pipe 76, respectively. In addition, in FIG. 3 the reference numerals V56, V66*a*, V66*b*, and V76 are valves provided in the developer supply pipe 56, the cleaning liquid supply pipe 66*a*, the gas supply pipe 66*b*, and the developer supply pipe 76, respectively, and the reference numerals M56, M66*a*, M66*b*, and M76 are flow rate adjusting units, respectively.

The developing nozzle unit 5 is configured to be freely moved forward and rearward in the front and rear direction between the processing position in which a processing liquid is supplied to the wafer W on the spin chuck 2 illustrated in FIG. 1 and the stand-by position at the rear side opposite to the front side in which the wafer W is carried in/out in the front and rear direction as illustrated in FIG. 4. Similarly, the cleaning nozzle unit 6 and the auxiliary nozzle unit 7 are configured to be movable forward and rearward in the front and rear direction by the moving bases 64, 74 along the guide rails 65, 75 between the processing position where the processing fluid is supplied to the wafer W and the stand-by position illustrated in FIG. 4.

In this example, the moving forward and rearward directions of the developing nozzle unit 5, the cleaning nozzle unit 6, and the auxiliary nozzle unit 7 are parallel in the front and rear direction of the case 10. The developing nozzle unit 5, the cleaning nozzle unit 6, and the auxiliary nozzle unit 7 are arranged in parallel in the order of the developing nozzle unit 5, the auxiliary nozzle unit 7, and the cleaning nozzle unit 6 from the left side in the left and right direction of the case 10, and as illustrated in FIG. 4, the developing nozzle 51, the cleaning nozzle 61*a*, the gas nozzle 61*b*, and the auxiliary nozzle 71 are arranged in a line in this order from the front side toward the rear side when the nozzle units 5, 6, 7 are disposed in the stand-by position. In addition, the height positions of the upper surfaces of the nozzle arms 52, 62, 72 of the nozzle units 5, 6, 7 are arranged in parallel when the nozzle units 5, 6, 7 are located in the stand-by position. In addition, a collecting bus 79 is provided below the developing nozzle 51, the cleaning nozzle 61*a*, the gas nozzle 61*b*, and the auxiliary nozzle 71 when the developing nozzle unit 5, the cleaning nozzle unit 6, and the auxiliary nozzle unit 7 are disposed in the stand-by position.

In addition, returning to FIGS. 1 and 2, in a region vicinity of the rear side of the case 10, provided is a cover member 15 covering the upper side than the driving region where the moving mechanism including the moving bases 54, 64, 74 and the guide rails 55, 65, 75 in the rear side of the case 10 and the elevating mechanisms 59, 69 elevating the support pillars 53, 63, 73. The cover member 15 includes a top plate portion 20 in a rectangular plate shape, and a partition wall portion 19 provided to be extended downward from an end at the front side in the top plate portion 20. Three openings 16*a*, 16*b*, 16*c* are formed in the top plate portion 20, which are formed in a hook shape corresponding to the shapes of the nozzle arms 52, 62, 72 of the nozzle units 5, 6, 7 disposed in the stand-by position. The openings 16*a*, 16*b*, 16*c* are formed in such a size as to accommodate the nozzle arms 52, 62, 72 corresponding to the openings 16*a*, 16*b*, 16*c*. The openings 16*a*, 16*b*, 16*c* are configured to be blocked by the nozzle arms 52, 62, 72 by positioning the nozzle units 5, 6, 7 in the stand-by position. Thus, it is said that the upper sides of the moving bases 54, 64, 74 of the nozzle units 5, 6, 7 respectively are covered with the cover member 15 and the nozzle arms 52, 62, 72 by positioning the nozzle units 5, 6, 7 at the stand-by position. In addition, each of the openings 16*a*, 16*b*, 16*c* are configured to be extended from the rear side toward the front side, and these directions are parallel to the moving directions of the support pillars 53, 63, 73 supporting the nozzle arms 52, 62, 72, respectively, when the nozzle units 5, 6, 7 are moved from the stand-by position toward the front side. Thus, it is said that the support pillars 53, 63, 73 can move along the openings 16*a*, 16*b*, 16*c*, respectively, and the openings 16*a*, 16*b*, 16*c* are formed along the moving paths of the support pillars 53, 63, 73, respectively.

In addition, a punching plate 17 which is a partition plate configured to surround the cup body 3 and divide the vicinity of the cup body 3 into upside and downside is provided in an area of the vicinity of the front side of the case 10. The punching plate 17 is continuously provided to be extended horizontally from the lower end of the partition wall portion 19. Thus, a gap between the punching plate 17 and the cover member 15 is closed by the partition wall portion 19. In addition, a space below the punching plate 17 is communicated with a space as the driving space below the cover member 15, and the above-described second exhaust port 94 is opened to the space below the punching plate 17. Therefore, the space below the punching plate 17 and the space as the driving region below the cover member 15 are exhausted by exhausting from the second exhaust port 94. In addition, a fan filter unit (FFU) 18 is provided in the upper side of the cup body 3 within the case 10 so as to supply a down flow of clean air toward the cup body 3.

In addition, the developing apparatus includes a controller 100. The controller 100 is configured as, for example, a computer having a program storage unit (not illustrated), the program storage unit stores a computer program having steps (commands) group about operations which performs the developing process described later using the developing nozzle unit 5, the cleaning nozzle unit 6, and the auxiliary nozzle unit 7. Then, the controller 100 reads the computer program and thus, the controller 100 controls the operation of the developing apparatus. This computer program is stored in the program storage unit in a state of being stored in a storage medium such as, for example, a hard disk, a compact disk, a magnet optical disk, or a memory card.

Then, the operation of the developing apparatus according to the above-described embodiments will be disclosed. A wafer W is carried into the developing apparatus by an external transfer mechanism (not illustrated). A resist is applied to the wafer W carried into the developing apparatus, and the resist is subjected to a predetermined exposure processing.

Figure 8:
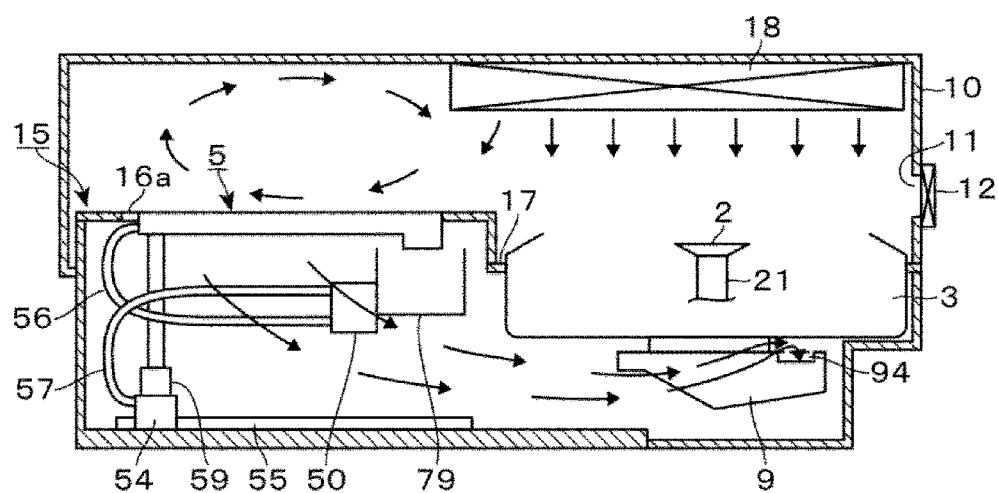
FIG. 8 is an explanatory view illustrating the operation of the present disclosure.

At first, as illustrated in FIG. 8, the down flow is supplied from the FFU 18 in a state where, before the carrying-in of the wafer W, the shutter 12 of the carry-in/out port 11 is closed, and each of the nozzle units 5, 6, 7 is located in the stand-by position. In addition, the exhaust duct 9 is switched to the module exhaust. As a result, the inside of the cup body 3 is not exhausted as described above, and the inside of the case 10 is exhausted from the second exhaust port 94.

At this time, since each of the nozzle units 5, 6, 7 is located at the stand-by position, each of the openings 16*a*, 16*b*, 16*c* of the cover member 15 is closed. Therefore, the down flow supplied from the FFU 18 is blocked by the cover member 15 and the nozzle arms 52, 62, 72 which close the openings 16*a*, 16*b*, 16*c*, respectively, and is convected above the cover member 15 in the rear side of the case 10. In addition, in the front side of the case 10, the down flow is not sucked in the cup body 3, and passes through the punching plate 17 and flows into the lower side of the case 10.

In addition, since the module exhaust is performed, the atmosphere below the punching plate 17 is exhausted from the second exhaust port 94. In addition, the atmosphere below the cover member 15 also flows under the punching plate 17 to be exhausted from the second exhaust port 94.

At this time, in a portion where the moving bases 54, 64, 74 or the wiring restricting members 8, etc. are driven, particles generated by the driving may be attached, but the upper side of the driving region is blocked by the cover member 15. In addition, the partition wall portion 19 of the cover member 15 blocks a position where the moving bases 54, 64, 74 face from the wafer W held by the spin chuck 2. Therefore, the down flow supplied from the FFU 18 does not reach the particles, and the particles are not rolled up by the down flow. In addition, the particles adhered on the moving bases 54, 64, 74 or the wiring restricting members 8 are captured and removed from an air stream flowing into the second exhaust port 94 in the lower side of the cover member 15.

Thereafter, a wafer W is carried-in to the upper side of the developing processing unit 1 via the carry-in/out port by an external transfer mechanism, and the wafer W is transferred to the spin chuck 2 by the cooperative action of the transfer mechanism and the support pins 392.

Figure 9:
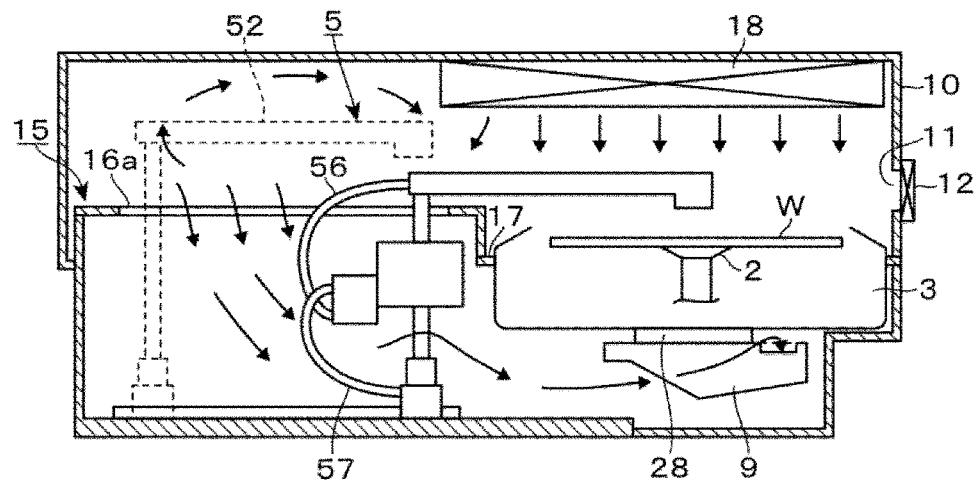
FIG. 9 is an explanatory view illustrating the operation of the present disclosure.

Next, as illustrated in FIG. 9, the developing nozzle unit 5 is raised in a state where the module exhaust is maintained. At this time, by raising the first nozzle arm 52 while advancing the moving base 54, the interference between the developer supply pipe 56 connected to the rear side of the first nozzle arm 52 and the cover member 15 is avoided. By advancing the moving base 54 more, the developing nozzle 51 is moved to a space above the wafer W. At this time, the support pillar 53 supporting the first nozzle arm 52 is moved to the front side along the opening 16a formed corresponding to the developing nozzle unit 5. In addition, the developing nozzle 5 is descended to a height position where the discharging port thereof from the surface of the wafer W is 15 mm to 20 mm. At this time, since the atmosphere in the driving region below the cover member 15 is exhausted, an air stream flowing into the driving region via the opening 16a is formed.

Figure 10:
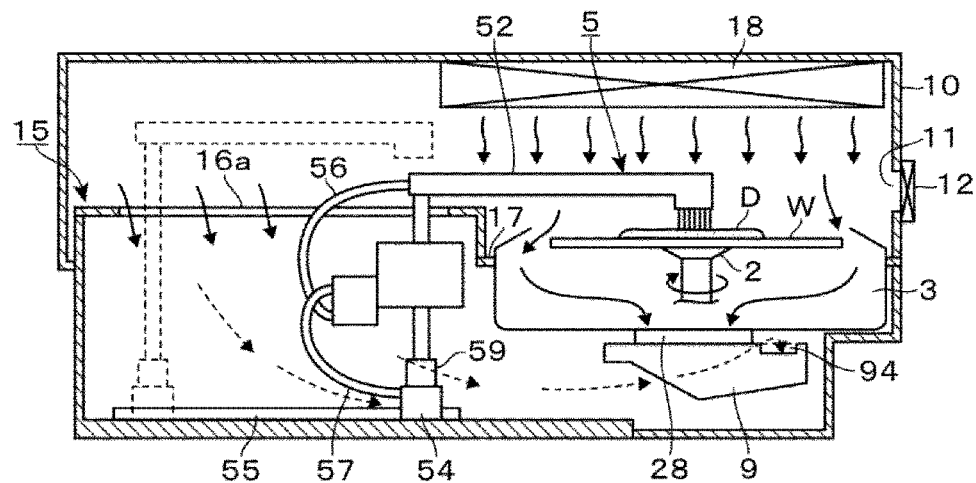
FIG. 10 is an explanatory view illustrating the operation of the present disclosure.

Next, as illustrated in FIG. 10, the exhaust is switched such that the cup exhaust is performed. As a result, an air stream flowing into the exhaust pipe 38 from the upper side of the cup body 3 is formed within the cup body 3 and is exhausted. Although the exhaust amount from the second exhaust port 94 is decreased, it continues to be performed. As described above, since the down flow of the FFU 18 is blocked by the cover member 15, the particles adhered to the driving region are not rolled up, and adhesion of particles to the wafer W held by the spin chuck 2 is suppressed.

Figure 11:
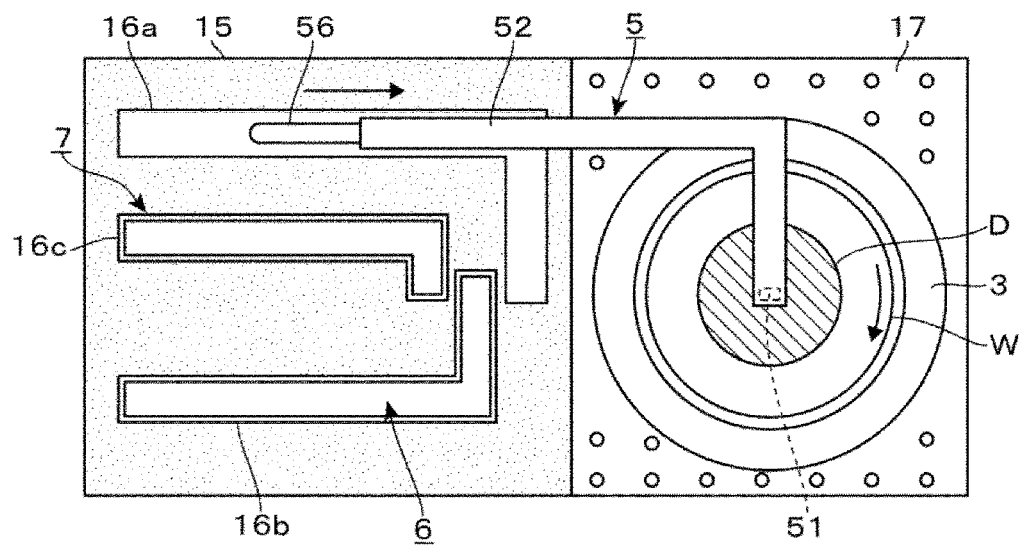
FIG. 11 is an explanatory view illustrating the operation of the present disclosure.

Further, as illustrated in FIGS. 10 and 11, the developer is supplied from the developing nozzle 51 to an area including the center portion of the wafer W while the wafer W is being rotated by the spin chuck 2. The developer D supplied to the center portion of the wafer W is spread to the peripheral side of the wafer W by the spin coating. At this time, while the developer is ejected from the developing nozzle 51, the developing nozzle 51 may move forward and rearward in the front and rear direction between the center portion and the outer direction of the wafer W.

When the developing nozzle 51 is moved to the processing position, as illustrated in FIG. 10, the developer supply pipe 56 is fixed to the fixture 50 at the upstream side thereof and is fixed to the rear side of the first nozzle arm 52 at the downstream side thereof. As a result, the developer supply pipe 56 is bent and deformed in the front and rear direction along the advancing of the first nozzle arm 52.

In addition, the wiring portion 57 tries to bend and deform in the top and down direction similarly to the developer supply pipe 56. However, since the left and right bending is restricted by the wiring restricting member 8, the wiring portion 57 does not shift in the left and right direction and is bent and deformed while sliding toward the front and rear direction. The developer supply pipe 56 and the wiring portion 57 are disposed to be spaced from each other in the left and right direction, and are bent toward the front and rear direction. Therefore, when the first nozzle arm 52 is moved in the front and rear direction, the developer supply pipe 56 and the wiring portion 57 do not interfere with each other.

As illustrated in FIG. 11, in the cover member 15, the opening 16a in which the first nozzle arm 52 was located is opened, but other openings 16b, 16c are blocked by the second nozzle arm 62 and the third nozzle arm 72, respectively. Therefore, only one opening 16a is opened, and the down flow supplied from the FFU 18 at the upper side enters the lower side of the cover member 15, but hardly flows from the opening 16a to the upper side of the cover member 15 against the down flow. Therefore, the particles in the lower side of the cover member 15 are not rolled up to flow toward the cup body 3 side.

Figure 12:
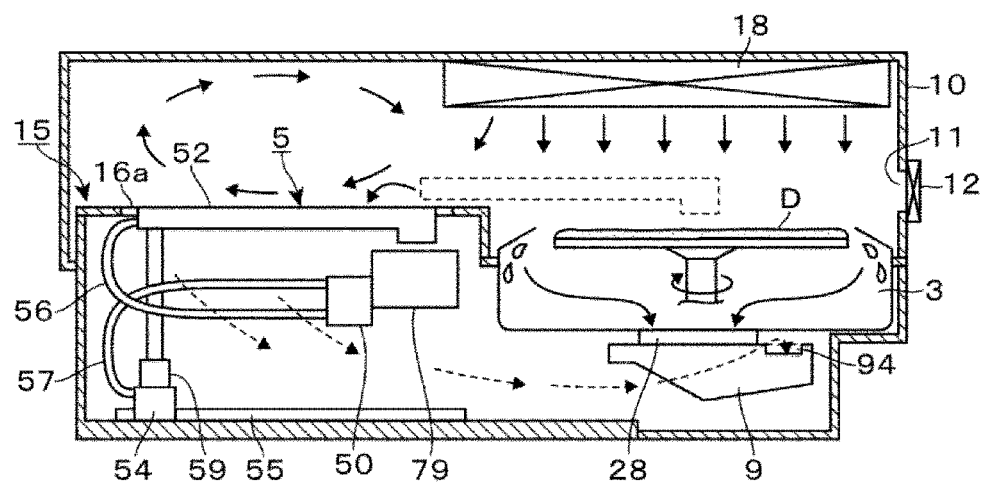
FIG. 12 is an explanatory view illustrating the operation of the present disclosure.

Then, as illustrated in FIG. 12, after the discharging of the developer is stopped, the first nozzle arm 52 is raised, and then, the developing nozzle unit 5 is moved to the rear side and the first nozzle arm 52 is descended. At this time, by descending the first nozzle arm 52 while moving the moving base 54 to the rear side, the interference between the developer supply pipe 56 connected to the rear side of the first nozzle arm 52 and the cover member 15 is avoided. As a result, the developing nozzle unit 5 is returned to the stand-by position, and the opening 16a is blocked by the first nozzle arm 52. Then, in a state where the cup exhaust is maintained, the wafer W is rotated to spread the developer over the entire surface of the wafer W, developing processing is performed, and the number of revolutions of the wafer W is further increased to shake off the developer.

Figure 13:
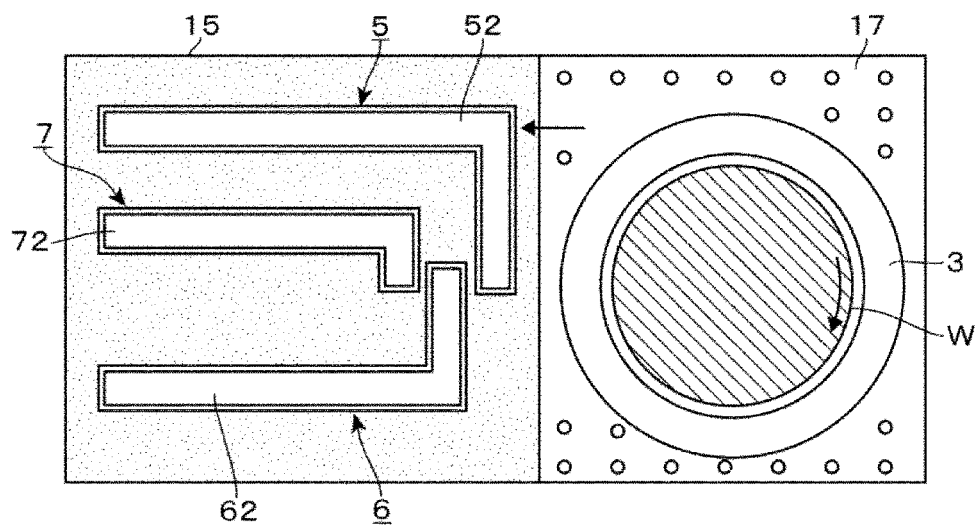
FIG. 13 is an explanatory view illustrating the operation of the present disclosure.

At this time, as illustrated in FIG. 13, since each of the nozzle units 5, 6, 7 is located in the stand-by position, the openings 16a, 16b, 16c of the cover member 15 are blocked by the first nozzle arm 52, the second nozzle arm 62, and the third nozzle arm 73, respectively. Therefore, the down flow supplied from the FFU 18 is blocked by the cover member 15 and the nozzle arms 52, 62, 72.

Figure 14:
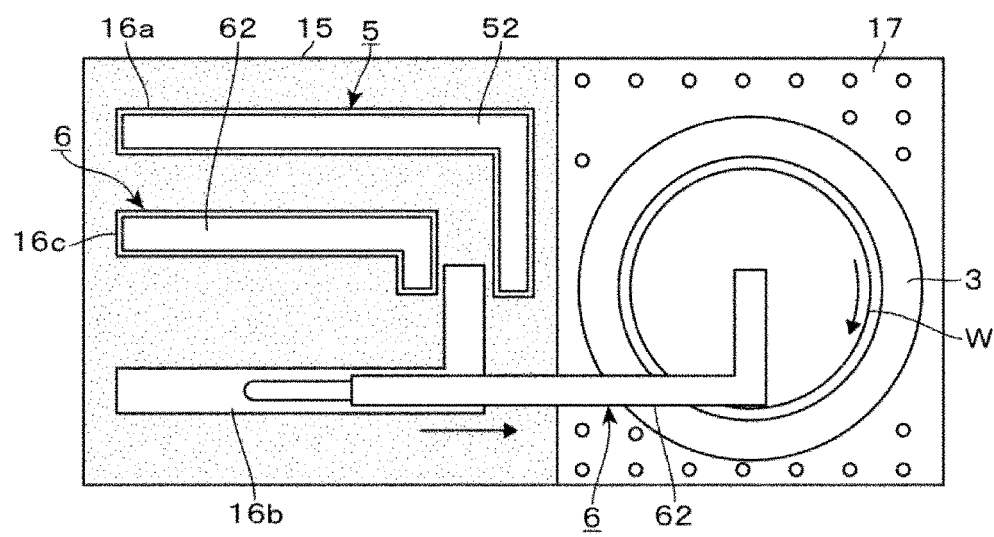
FIG. 14 is an explanatory view illustrating the operation of the present disclosure.

Subsequently, the exhaust is switched to the module exhaust, and as illustrated in FIG. 14, the cleaning nozzle unit 6 is raised and advanced in the same manner as the movement of the developing nozzle unit 5. After the cleaning nozzle unit 6 is moved to a space above the center portion of the wafer and then is descended to adjust the height of the cleaning nozzle 61a. In addition, the exhaust is switched to the cup exhaust, and deionized water as the cleaning liquid is ejected to the area including the center portion of the surface of the wafer W while rotating the wafer W. The ejected cleaning liquid is spread outwardly along the liquid surface by the action of the centrifugal force of the wafer W to clean the developer containing the resist dissolving component on the surface of the wafer W, and thus, the surface of the wafer W is cleaned.

After a lapse of a predetermined time from the start of the discharging of the cleaning liquid, the supply of the cleaning liquid is stopped, and the cleaning nozzle unit 6 is moved forward and rearward so that the gas nozzle 61b is located at the processing position, and then a nitrogen gas as a dry gas is supplied to the area including the center portion of the wafer W. A gas stream flowing from the center portion toward the peripheral portion of the wafer W is formed by the supply of the dry gas and the exhaust within the cup body 3, and due to the action of the gas stream and the centrifugal force, the liquid adhered to the wafer W is removed from the wafer W, and thus, the wafer W is dried.

Figure 15:
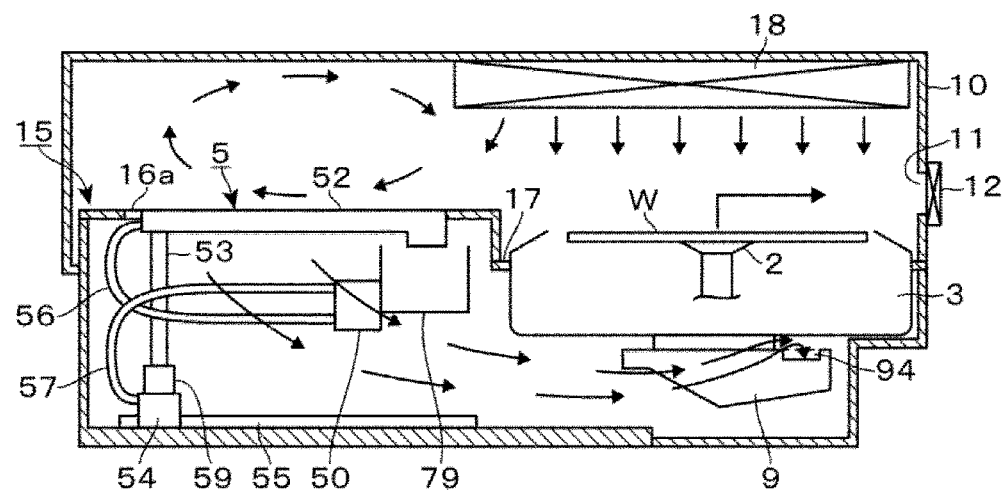
FIG. 15 is an explanatory view illustrating the operation of the present disclosure.

Further, when the developing processing of the wafer W is completed, as illustrated in FIG. 15, the exhaust is switched to the module exhaust and the wafer W is carried out. Then, the module exhaust is performed in, for example, a state where each of the nozzle units 5, 6, 7 is located at the stand-by position. Since the nozzle units 5, 6, 7 are moved for the processing of the wafer W, particles may be generated at the moving mechanisms, the elevating mechanisms 59, and the wiring restricting members 8. However, since the down flow supplied from the FFU 18 is blocked by the cover member 15 and the respective nozzle arms 52, 62, 72 which block the respective openings 16a, 16b, 16c, the particles are not rolled up. Further, since the atmosphere below the cover member 15 is exhausted from the second exhaust port 94, the generated particles are removed.

The above description relates to a case where the processing is performed by using the developing nozzle unit 5. However, when another developer is supplied to a substrate of another lot different from the lot of the above-described case, a developing processing is performed using by the auxiliary nozzle unit 7 instead the developing nozzle unit 5.

In this case, when the developer is supplied to the wafer W, by moving the auxiliary nozzle unit 7 while the developing nozzle unit 5 is located at the stand-by position, the opening degree of the openings 16a, 16b, 16c of the cover member 15 can be limited.

According to the above-described embodiments, when processing is performed by supplying processing fluids from each of the nozzle units 5, 6, 7 to the wafer W held horizontally, the upper side of the moving bases 54, 64, 74 and the guide rails 55, 65, 75 which move each of the nozzle units 5, 6, 7 between the upper side of the wafer W and the stand-by position, is covered by the cover member 15 in which openings 16a, 16b, 16c for moving the respective nozzle units 5, 6, 7 are formed therein, and the driving region below the cover member 15 is exhausted. Further, when the nozzle units 5, 6, 7 are located in the stand-by position, the openings 16a, 16b, 16c are blocked by the nozzle arms 52, 62, 72 of the respective nozzle units 5, 6, 7. Therefore, particles generated in the moving bases 54, 64, 74 of the respective nozzle units 5, 6, 7 are not scattered toward the wafer W, and adhesion of particles to the wafer W can be suppressed.

The sizes of the openings 16a, 16b, 16c are formed such that, even though there is a slight gap when the nozzle arms 52, 62, 72 are accommodated thereto, the particles below the cover member 15 do not flow out toward the wafer W held in the spin chuck 2. The width of the gap between the top plate portion 20 and the nozzle arms 52, 62, 72 accommodated in the respective openings 16a, 16b, 16c may be, for example, in the range of 2 mm to 7 mm.

Further, the moving bases 54, 64, 74 of the respective nozzle units 5, 6, 7 are provided at a height position lower than the top end of the cup body 3. In a case where the positions of the moving bases 54, 64, 74 as a generation source of the particles are high, since they are close to the FFU 18, the particles are easily influenced by the air stream and are likely to be rolled up by the down flow. Therefore, by setting the moving bases 54, 64, 74, the guide rails 55, 65, 75 and the wiring regulating members 8 to a low position, specifically a position lower than the top end of the cup body 3, the adhesion of the particles to the wafer W can be suppressed.

Figure 16:
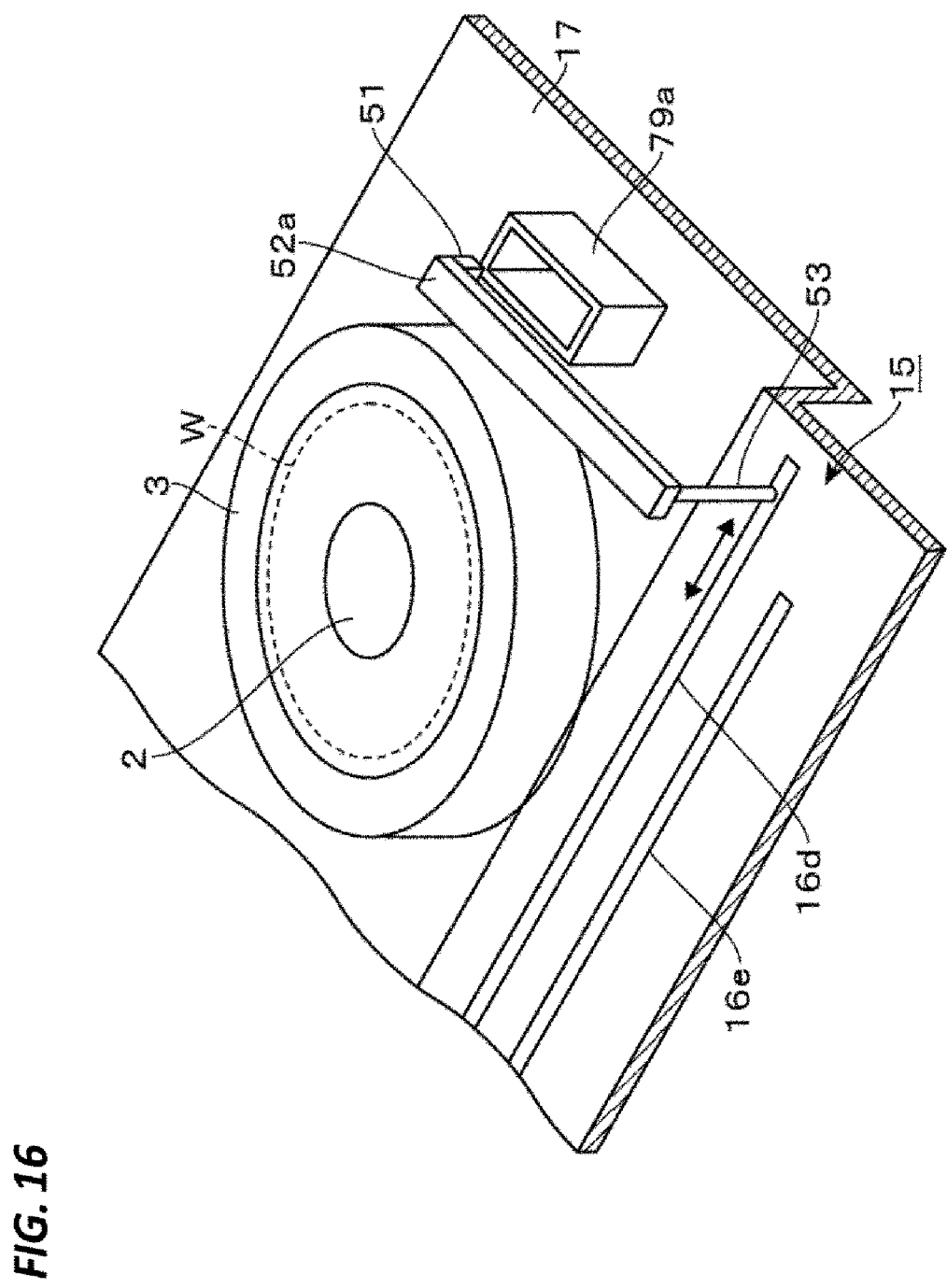
FIG. 16 is a perspective view illustrating another example of the liquid processing apparatus of the present disclosure.

Further, according to the present disclosure, the nozzle supported by the nozzle arm extending in the front and rear direction may be configured to be moved in the left and right direction of the housing 10. For example, as illustrated in FIG. 16, a developer nozzle 51 is provided at the tip end of a nozzle arm 52a extending in the front and rear direction, and the rear end of the nozzle arm 52a is supported by a supporting pillar 53. Then, the supporting pillar 53 is configured to be moved in the left and right direction, and a moving mechanism that moves the developer nozzle 51 in the left and right direction between the upper side of the cup body 3 and the a stand-by bus 79a outside the cup body 3, is provided below the cover member 15, and an opening 16d extending in the left and right direction is provided in the top plate portion 20. In addition, reference numeral 16e in the drawings denotes an opening in which a supporting pillar for supporting another nozzle (not illustrated) is disposed.

Even in such a configuration, by covering the upper side of the driving region with the cover member 15 and forming the opening 16d for moving a nozzle in the cover member 15, the scattering of the particles generated in the driving region toward the cup body 3 side can be suppressed, which is effective.

Further, the present disclosure may have a single nozzle. In addition, as illustrated in the above-described embodiments, even in a case where a plurality of nozzles are provided, other nozzles except one nozzle supplying a processing fluid to the wafer W may be located at the stand-by position. When one nozzle is moved from the stand-by position, an opening corresponding to the nozzle is opened. Therefore, by limiting the number of the processing liquid nozzles moving at the same time from the stand-by position, it is possible to suppress many openings from being opened at the same time. Therefore, there is less possibility that particles generated below the cover member 15 are rolled up toward the upper side of the cover member 15.

Further, when the nozzle is moved from the stand-by position to the processing position as in the above-described embodiments, the exhaust may be switched to the module exhaust. As a result, when moving the nozzle from the stand-by position to the processing position, it is possible to form an air stream in which the atmosphere outside the cover member 15 flows into the driving region via the openings 16a, 16b, 16c. Therefore, it is possible to further suppress the particles generated in the driving region from flowing out toward the cup body 3 side.

A top plate portion may be provided above the moving mechanism and a partition wall portion extending downward may be provided at the end portion on the spin chuck side of the top plate portion. When seen from the wafer W held by the spin chuck 2, when the moving bases 54, 64, 74 faces below the top plate portion, it is difficult that the particles generated below the cover member flow out from the lower side to the spin chuck side to the spin chuck side. Therefore, by providing the partition wall portion, scattering of particles to the wafer W side can be further suppressed.

Alternatively, by lowering the stand-by position of the nozzle, the top plate portion 20 may be lowered. Even in the configuration without the partition wall portion 19, by disposing the top plate portion 20 at a low position, it is possible to get off the moving mechanism or the elevating mechanism from a position to which the wafer W held by the spin chuck 2 faces. Therefore, scattering of particles generated in the moving mechanism or the elevating mechanism toward the wafer W side is suppressed.

Further, the auxiliary nozzle may be configured as a nozzle for discharging a cleaning liquid and an $N_2$ gas, respectively, and the second nozzle and the third nozzle may be simultaneously moved to a positon above the wafer W to perform cleaning processing. Even in such a configuration, even when the second nozzle and the third nozzle are simultaneously moved to the position above the wafer W, by making the first nozzle stand-by at the stand-by position, the number of the openings to be opened is reduced, which is effective.

Further, in the above-described embodiments, the cup body 3 surrounding the lateral side and the lower side of the wafer W held by the spin chuck 2 and having the first exhaust port 39 opened thereto is provided, and the exhaust duct 9 that performs exhaust from the first exhaust port 39 is provided. In addition, in the exhaust duct 9, a second exhaust port is provided in a portion between the cup body 3 and the carry-in/out port 11 of the wafer W formed in the case 10, and a damper 95 for switching the exhaust to the exhaust path between the first exhaust port 39 and the second exhaust port 94. Therefore, it is possible to suppress the outflow of particles to the outside of the case 10 through the carry-in/out port 11. Further, as seen from the cup body 3, since the exhaust path is provided in a direction different from the direction in which the moving mechanism of the nozzle is provided, the height position of the moving mechanism can be further lowered. Therefore, the risk of particles scattering becomes smaller.

In addition, the movements of the wirings 80 connected to the moving bases 54, 64, 74 are restricted by the wiring restricting members 8 such that the wirings 80 and the processing fluid supply pipes do not come into contact with each other, but the wiring restricting members 8 contact to each other, thus particles are easily generated. Therefore, in a liquid processing apparatus to which the wiring restricting member 8 is applied, the wiring restricting member 8 is arranged below the cover member 15 and further below the opening 31 of the cup body 3. As a result, the scattering of particles generated from the wiring restricting member 8 to the wafer W side can be suppressed, which is more effective.

Further, the present disclosure may be applied to a resist coating apparatus or a cleaning apparatus. Further, the present disclosure is not limited to an apparatus in which a processing liquid (e.g., a developer) is supplied, but may be applied to an apparatus in which a processing fluid (e.g., gas or mist) is applied to a substrate. Alternatively, the present disclosure may be applied to an apparatus in which steam is supplied to a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
   a cup body provided to surround a substrate holder that horizontally holds a substrate;
   a nozzle arm provided with a nozzle in a front end portion thereof and supported by a support at a rear end portion thereof;
   a mover configured to move the nozzle arm via the support between a stand-by position and a processing position where a processing fluid is supplied from the nozzle to the substrate;
   a lift configured to move the support up and down;
   a cover including a top plate covering a driving region where the mover and the lift are disposed and configured to partition the driving region from a region where the substrate is held within the cup body;
   an opening formed in a portion corresponding to a moving path of the support in the top plate so as to allow the support to move therethrough; and
   an exhaust configured to evacuate the driving region,
   wherein the nozzle arm is configured to block the opening, the opening being formed in such a size as to accommodate the nozzle arm in the stand-by position.

2. The liquid processing apparatus of claim 1, further comprising a partition plate provided to surround the cup body and defining an upper side space and a lower side space,
   wherein the cover member is formed continuously with the partition plate.

3. The liquid processing apparatus of claim 1, wherein the stand-by position is located on a rear side of the cup body, and
   the mover is configured to move the nozzle arm in a front and rear direction.

4. The liquid processing apparatus of claim 1, further comprising a plurality of nozzle arms configured to be independently movable in a lateral direction and movable up and down,
   wherein a plurality of supports are arranged in a left and right direction with respect to each other to respectively support the plurality of nozzle arms, and
   a plurality of nozzles respectively provided on the plurality of nozzle arms, the plurality of nozzle arms being arranged in the front and rear direction.

5. The liquid processing apparatus of claim 4, wherein, when one nozzle is moved from the stand-by position to supply a processing fluid among the plurality of nozzles to the substrate, another nozzle is located in the stand-by position.

6. The liquid processing apparatus of claim 1, wherein a horizontal dimension of a gap between a lateral edge of the nozzle arm and an edge of the opening is within 7 mm.

7. The liquid processing apparatus of claim 1, further comprising:
   a first exhaust port opened to the cup body;
   a second exhaust port opened to a region below the partition plate; and
   a switch configured to switch an exhaust flow rate ratio between the first exhaust port and the second exhaust port,
   wherein the partition plate is provided with a plurality of vent holes that draw an atmosphere on the upper side of the partition plate to the lower side of the partition plate.

8. The liquid processing apparatus of claim 1, wherein, when the nozzle arm is moved from the stand-by position to the processing position, the switch is switched such that an exhaust flow rate of the second exhaust port is larger than an exhaust flow rate of the first exhaust port.

9. The liquid processing apparatus of claim 1, further comprising:
   a wiring connected at one end to the mover and the lift and configured to drive the mover and the lift;

a fixture configured to fix another end of the wiring such that the another end of the wiring is stationary when the mover moves; and a wiring restricting member formed in an elongated shape having a joint portion and configured to be bent according to the movement of the mover to protect and guide a portion of the wiring between a connecting position at the one end side of the wiring and a fixed position fixed to the fixture at the another end of the wiring, wherein the wiring restricting member is provided in a height position in the driving region, which is lower than a height position of the opening surface of the cup body.

10. The liquid processing apparatus of claim 1, wherein a top surface of the nozzle and a top surface of the top plate of the cover are flush in the stand-by position.

* * * * *